United States Patent [19]
Sugita

[11] Patent Number: 5,949,736
[45] Date of Patent: Sep. 7, 1999

[54] MEMORY CONTROL CIRCUIT REDUCING A CONSUMED POWER OF MEMORY

[75] Inventor: Hisao Sugita, Niigata, Japan

[73] Assignee: NEC Corporation, Tokyo, Japan

[21] Appl. No.: 08/966,201

[22] Filed: Nov. 7, 1997

[30] Foreign Application Priority Data

Nov. 7, 1995 [JP] Japan .................................. 8-294877

[51] Int. Cl.[6] ........................................................ G11C 8/00
[52] U.S. Cl. .................................. 365/230.06; 365/238.5
[58] Field of Search .................................. 365/226, 227, 365/230.03, 230.06, 235, 238.5

[56] References Cited

U.S. PATENT DOCUMENTS 5,721,862  2/1998  Sartore et al. ..................... 365/189.04
5,774,409  6/1998  Yamazaki et al. .................. 365/230.03

FOREIGN PATENT DOCUMENTS 3-269653  12/1991  Japan .

*Primary Examiner*—David Nelms
*Assistant Examiner*—Thong Le
*Attorney, Agent, or Firm*—Helfgott & Karas, P.C.

[57] ABSTRACT

A memory control circuit comprises a memory composed of eight DRAMs and coupled to a data bus having a but width of eight bytes, and a memory controller which is coupled through the data bus to the memory and which supplies a memory address, a write enable signal and a column address strobe signal to the memory. A CPU is coupled to the memory controller for controlling the memory controller, and generates a plurality of byte enable signals corresponding to the eight DRAMs in a one-to-one relation, respectively. A row address strobe control circuit receives a memory cycle start signal from the memory controller and the byte enable signals from the CPU, for outputting to the memory, a plurality of row address strobe signals corresponding to the eight DRAMs in a one-to-one relation, respectively. When one of the eight DRAMs is to be actually accessed, the CPU activates a corresponding byte enable signal, and the row address strobe control circuit selectively activates only one row address strobe signal corresponding to the activated byte enable signal.

5 Claims, 5 Drawing Sheets

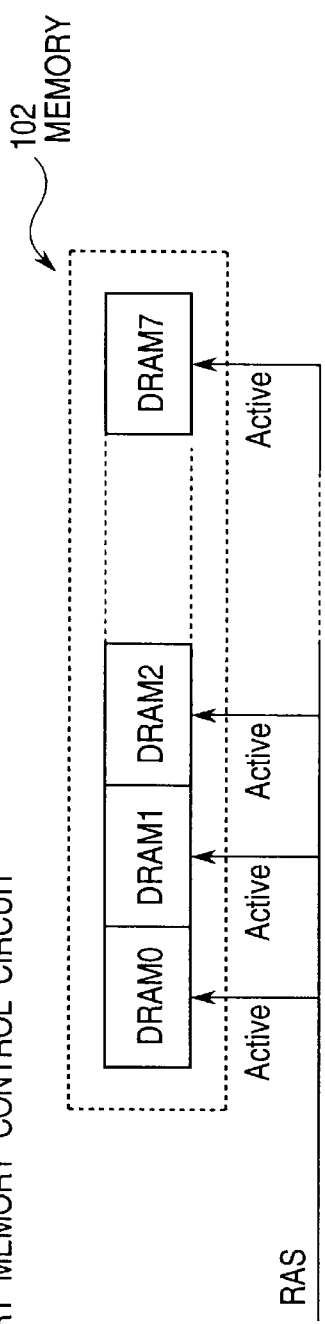
Fig. 4A  PRIOR ART MEMORY CONTROL CIRCUIT
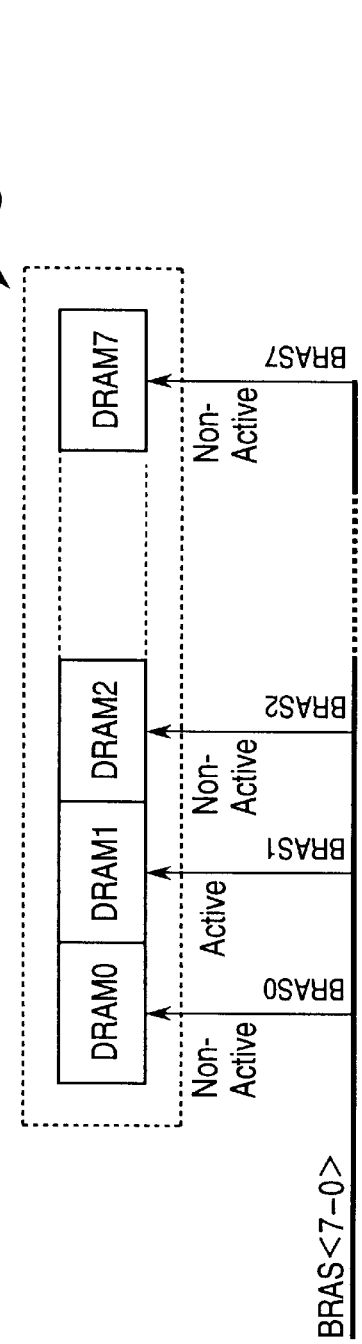
Fig. 4B  MEMORY CONTROL CIRCUIT OF INVENTION

MEMORY CONTROL CIRCUIT REDUCING A CONSUMED POWER OF MEMORY

BACKGROUND OF THE INVENTION

1. Field of the Invention

The present invention relates to a consumed power saving memory control circuit, and more specifically to a power saving memory control circuit reducing a consumed power of a memory.

2. Description of Related Art

For example, some memory control circuit has been composed of one bank which is connected to a 64-bit memory data bus. Considering this memory control circuit in units of bank, as shown in FIG. 1, the memory control circuit includes a memory controller 100 coupled through a 64-bit memory data bus MD<63–0> to a memory 102 composed of dynamic random access memories DRAM0 to DRAM7, which constitute one bank. The memory controller 100 is configured to access the memory 102 by use of a row address strobe signal RAS, a column address strobe signal CAS<7–0>, a write enable signal WE and a memory address MA. Here, the row address strobe signal RAS is supplied in common to all DRAM0 to DRAM7 included in the one bank.

In order to access the memory in the shown prior art memory control circuit, first, the row address strobe signal RAS is activated, so that a plurality of data on a plurality of rows corresponding to a strobed row address are read out and transferred to a corresponding number of row buffers (each called a "sense amplifier"). Thereafter, the column address strobe signal CAS is activated so that one data is selected from a plurality of data outputted from the plurality of sense amplifiers, and then, outputted through an output amplifier.

In this operation, when the row address strobe signal RAS is inactivate, a RAS related internal circuit is precharged, and, when the column address strobe signal CAS is inactivate, the CAS related internal circuit is precharged. When the row address strobe signal RAS is activated, the RAS related internal circuit is discharged as a result of the data reading, and when the column address strobe signal CAS is activated, the CAS related internal circuit is discharged as a result of the read-out data outputting. Therefore, by repeating activation and deactivation of the row address strobe signal RAS, each DRAM consumes an electric power.

In the prior art memory control circuit, however, since the row address strobe signal RAS is in common to all DRAMs included within the same bank, when the memory is accessed either in units of one byte or in units of one word which is smaller than the width of the memory data bus, the row address strobe signal RAS supplied to DRAMs other than the DRAM(s) to be accessed, are also activated. This results in an increased consumed electric power.

SUMMARY OF THE INVENTION

Accordingly, it is an object of the present invention to provide a memory control circuit which has overcome the above mentioned defect of the conventional one.

Another object of the present invention is to provide a memory control circuit capable of reducing a consumed power of a memory at a memory access time.

The above and other objects of the present invention are achieved in accordance with the present invention by a memory control circuit comprising:

a memory coupled to a data bus having a bus width corresponding to a plurality of bytes;

a memory control means coupled to the memory for controlling an access to the memory;

a processing means coupled to the memory control means for controlling the memory control means, the processing means outputting a plurality of byte enable signals corresponding to the plurality of bytes in a one-to-one relation, respectively, the processing means activating at least selected one of the plurality of byte enable signals when the memory is accessed in units of byte; and a row address strobe control means receiving a memory controller signal from the memory control means and the byte enable signals from the processing means, for outputting a plurality of row address strobe signals corresponding to the plurality of bytes in a one-to-one relation, respectively, the plurality of row address strobe signals being supplied to the memory, the row address strobe control means responding to the at least one activated byte enable signal, to selectively activate at least one row address strobe signal corresponding to the at least one activated byte enable signal, whereby the plurality of row address strobe signals are selectively activated in units of byte.

In one embodiment of the memory control circuit, the row address strobe control means includes a row address strobe generating means receiving the byte enable signals from the processing means for outputting the plurality of row address strobe signals, and a page miss discriminating means receiving the byte enable signals from the processing means and a row address to be accessed, from the memory control means, for discriminating a page missing in units of byte when the memory is accessed in units of byte.

In the one embodiment of the memory control circuit, after the row address strobe control means receives a memory cycle start signal from the memory control means, the row address strobe control means selectively activates the at least one row address strobe signal.

In a preferred embodiment of the memory control circuit, when the row address strobe control means discriminates a page missing in the memory accessed in units of byte, the row address strobe control means deactivates the at least one row address strobe signal corresponding to the at least one activated byte enable signal, so that a precharge time is ensured, and the row address strobe control means supplies a page miss signal to the memory control means to cause the memory control means to delay an outputting of a memory cycle start signal. After the row address strobe control means receives the memory cycle start signal from the memory control means, the row address strobe control means selectively activates the at least one row address strobe signal.

More specifically, the row address strobe control means includes a plurality of row address registers corresponding to the plurality of bytes in a one-to-one relation, respectively, and a corresponding number of address comparators each enabled by a corresponding byte enable signal to compare a row address supplied from the memory control means with a row address held in a corresponding row address register, so that when the row address supplied from the memory control means is not consistent with the row address held in the corresponding row address register, the address comparator causes only the corresponding row address register to newly hold the row address supplied from the memory control means.

The above and other objects, features and advantages of the present invention will be apparent from the following

BRIEF DESCRIPTION OF THE DRAWINGS

FIGS. 4A and 4B illustrate a RAS input section of the memory in the prior art memory control circuit and in the memory control circuit in accordance with the present invention, for explaining an advantage of the memory access in units of byte in accordance with the present invention.

DESCRIPTION OF THE PREFERRED EMBODIMENTS

Figure 2:
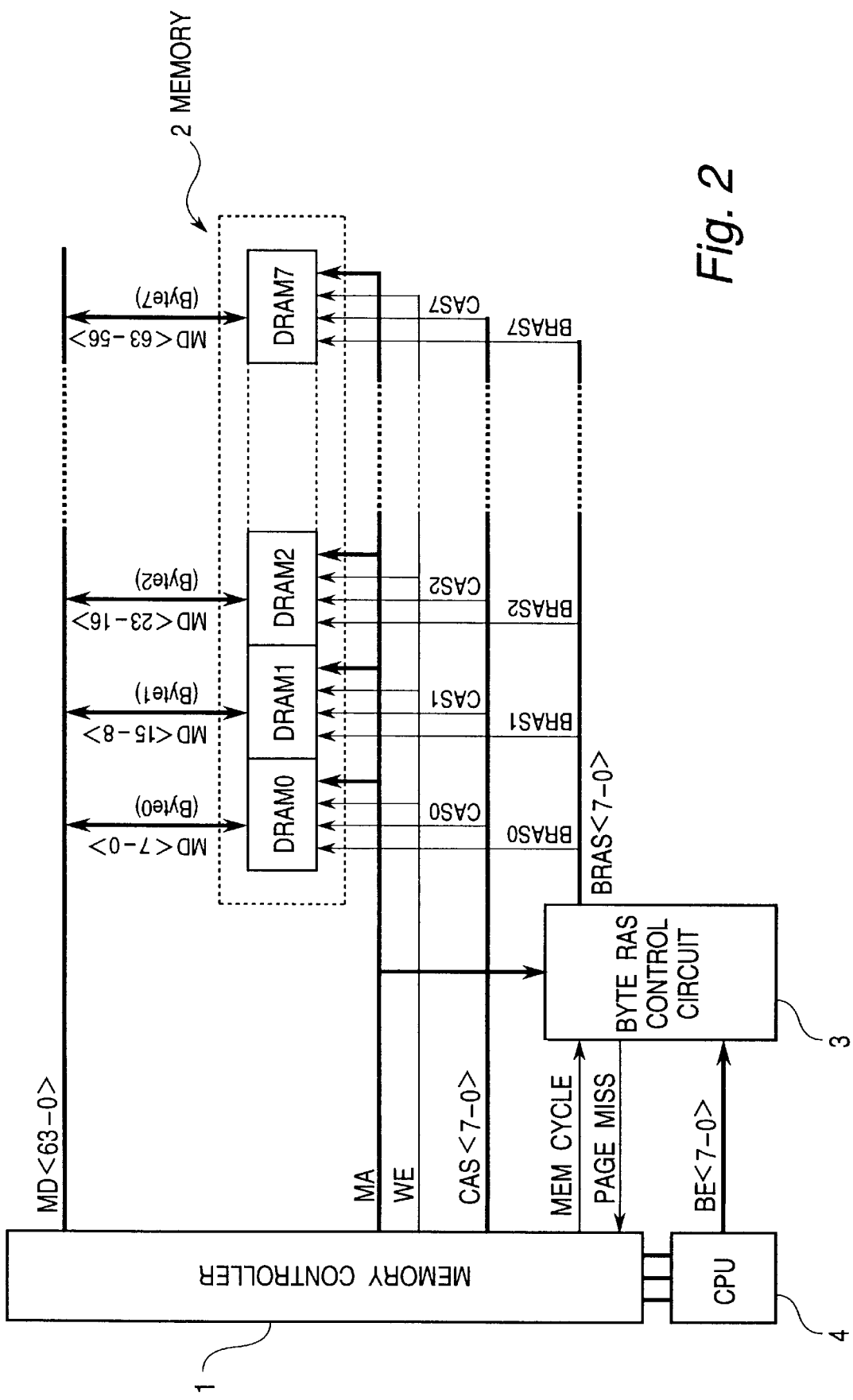
FIG. 2 is a block diagram of an embodiment of the consumed power saving memory control circuit in accordance with the present invention.

Referring to FIG. 2, there is shown a block diagram of an embodiment of the consumed power saving memory control circuit in accordance with the present invention.

The shown memory control circuit includes a memory controller 1, a memory 2, a Byte RAS (row address strobe) control circuit 3 and a CPU (central processing unit) 4, coupled as shown.

The memory 2 includes eight dynamic random access memories DRAM0 to DRAM7. The memory controller 1 is coupled through a 64-bit memory data bus MD<63–0> to the memory 2. The memory controller 1 outputs a memory address MA, a write enable signal WE, and a 8-bit column address strobe signal CAS<7–0> to the memory 2. Furthermore, the memory controller 1 outputs a memory controller signal including a memory cycle start signal MEM CYCLE to the Byte RAS control circuit 3. The CPU 4 is coupled to the memory controller 1 to control the memory controller 1, and outputs a 8-bit byte enable signal BE<7–0> to the Byte RAS control circuit 3. The Byte RAS control circuit 3 generates a 8-bit Byte RAS signal BRAS<7–0> to the memory 2. The Byte RAS signal BRAS is generated in units of byte, namely, one for each one byte. The Byte RAS control circuit 3 also receives a row address of the memory address MA, and generates a Page Miss signal PAGE MISS to the memory controller 1 when a page miss occurs.

More specifically, of the 64-bit memory data bus MD<63–0>, first 8 bits MD<7–0> (byte 0) are connected to the DRAM0, and second 8 bits MD<15–8> (byte 1) are connected to the DRAM1, and so on. Similarly, final 8 bits MD<63–56> (byte 7) are connected to the DRAM7. In the shown embodiment, therefore, each of the DRAM0 to DRAM7 corresponds to one byte. Of the 8-bit column address strobe signal CAS<7–0>, a first column address strobe signal CAS0 is supplied to the DRAM0, and a second column address strobe signal CAS1 is supplied to the DRAM1, and so on. Similarly, an eighth column address strobe signal CAS7 is supplied to the DRAM7. Of the 8-bit Byte RAS signal BRAS<7–0>, a first Byte RAS signal BRAS0 is supplied to the DRAM0, and a second Byte RAS signal BRAS1 is supplied to the DRAM1, and so on. Similarly, an eighth Byte RAS signal BRAS7 is supplied to the DRAM7.

Now, an advantage of the memory access in units of byte in accordance with the present invention will be described with reference to FIGS. 4A and 4B, on the case that the DRAM1 is accessed, at a first access in a page mode memory access or alternatively assuming that the page mode memory access is not conducted. FIG. 4A illustrates a RAS input section of the memory in the prior art memory control circuit as shown in FIG. 1, and FIG. 4B illustrates a RAS input section of the memory in the memory control circuit in accordance with the present invention.

Figure 1:
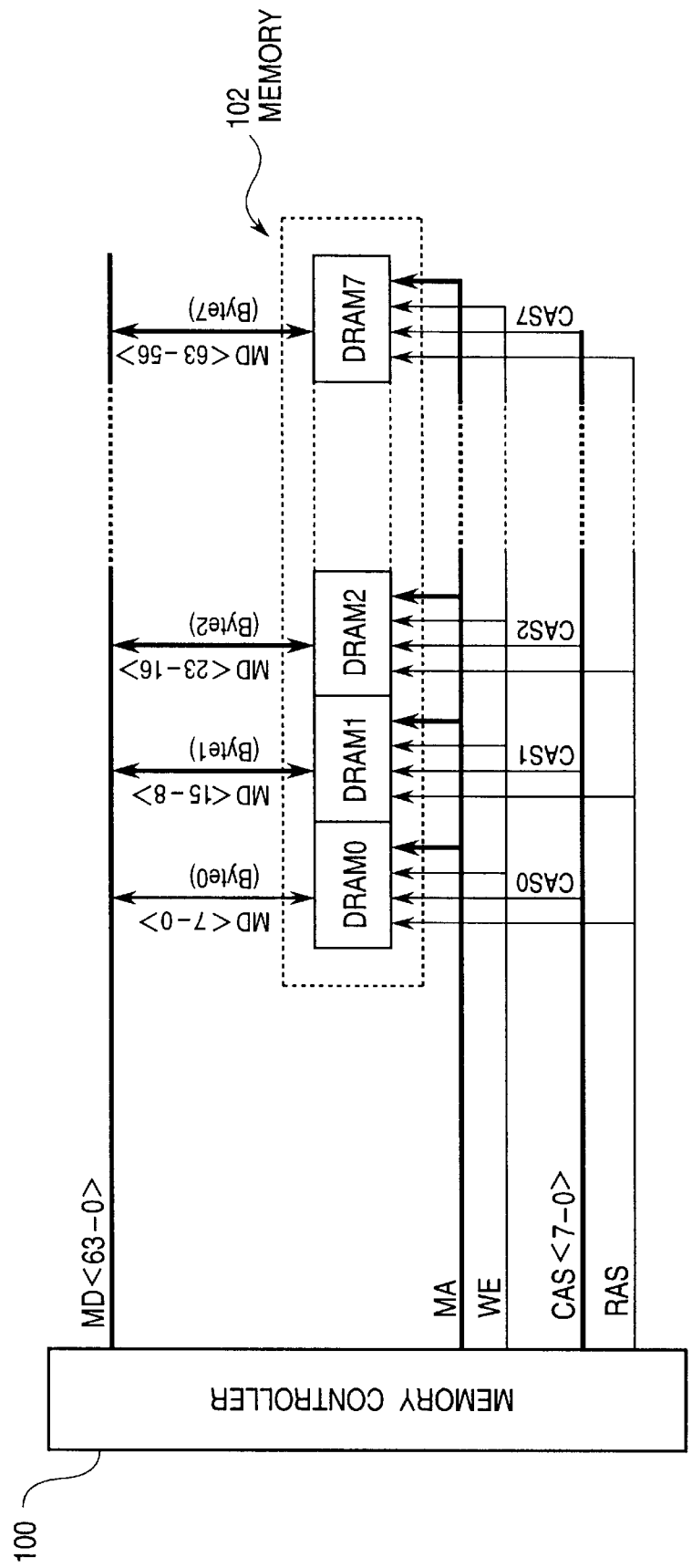
FIG. 1 is a block diagram of one example of a prior art memory control circuit.

In the prior art memory control circuit, since the RAS signal is common to all DRAM0 to DRAM7 included in one bank as shown in FIG. 1, not only the RAS signal supplied to the DRAM1 but also the RAS signal supplied to the DRAM0 and DRAM2 to DRAM7 which are not required to be accessed, are activated. Therefore, an electric power is consumed in all the DRAM0 to DRAM7.

In the memory control circuit in accordance with the present invention, on the other hand, the Byte RAS control circuit 3 activates only the BRAS signal BRAS1 supplied to the DRAM1, and maintains the other BRAS signals BRAS0 and BRAS2 to BRAS7 supplied to the DRAM0 and DRAM2 to DRAM7, in an inactive condition. Thus, an electric power is consumed in only the DRAM1, and the other DRAM0 and DRAM2 to DRAM7 do not substantially consume an electric power. As a result, the electric power consumption is greatly reduced in comparison with the prior art memory control circuit shown in FIG. 1.

In the case of accessing the memory 1 in units of one word which is smaller than the width of the memory data bus, it could be understood to persons skilled in the art that the CPU 4 selectively and simultaneously activates only the byte enable signals for the DRAMs to be accessed of the number corresponding to the number of bytes included in the one word.

Next, a construction of the Byte RAS control circuit 3 having a function of a page mode memory access in units of byte, will be described with reference to FIG. 3, which is a block diagram of the Byte RAS control circuit 3.

Figure 3:
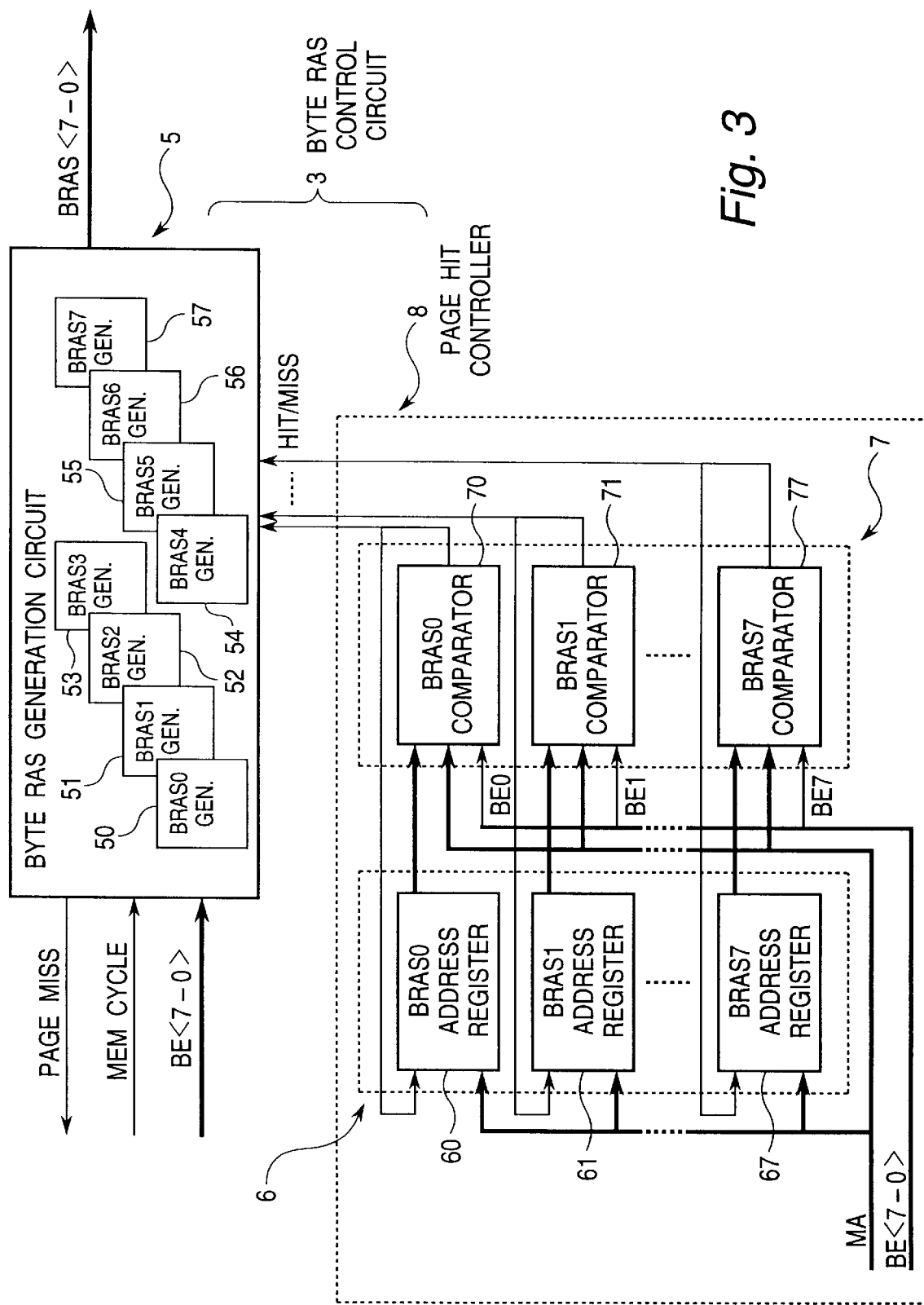
FIG. 3 is a block diagram of a Byte RAS control circuit which is incorporated in the memory control circuit shown in FIG. 2 and which is so constructed to realize a page mode memory access in units of byte.

As shown in FIG. 3, the Byte RAS control circuit 3 includes a Byte RAS generation circuit 5 and a page hit controller 8. For access in units of byte, the page hit controller 8 includes a BRAS0 address register 60, a BRAS1 address register 61, . . . , and a BRAS7 address register 67, which receive a row address portion of the memory address MA in parallel, and which will be genericially called a "BRAS address register". The page hit controller 8 also includes a BRAS0 comparator 70, a BRAS1 comparator 71, . . . , and a BRAS7 comparator 77, which also receive at their one input the row address portion of the memory address MA in parallel, and which will be genericially called a "BRAS comparator". Each of the BRAS comparators 70 to 77 also receives at its other input an output of a corresponding BRAS address register 60, 61, . . . , or 67, and is enabled by a corresponding one BE0, BE1, . . . , or BE7 of the byte enable signal BE<7–0>. Here, the BRAS address registers 60, 61, . . . , and 67 are provided one for each one byte, and similarly, the BRAS comparators 70, 71, . . . , and 77 are provided one for each one byte.

At each memory access, only the BRAS comparator 70, 71, . . . , or 77 receiving an active byte enable signal BE0, BE1, . . . , or BE7, is enabled to compare the row address of the memory address MA with the row address held in the corresponding BRAS address register 60, 61, . . . , or 67, and generates an active page mishitting signal HIT/MISS when the row address of the memory address MA is not consistent with the row address held in the corresponding BRAS address register. Here, each of the BRAS comparators 70 to 77 is configured to maintain the page mishitting signal HIT/MISS in an inactive condition when the BRAS comparator is not enabled by the corresponding byte enable signal BE0, BE1, . . . , or BE7, or when the row address of the memory address MA is consistent with the row address held in the corresponding BRAS address register. The page mishitting signal HIT/MISS is supplied to the Byte RAS generation circuit 5 and is also fed back to the corresponding BRAS address register 60, 61, . . . , or 67. Therefore, only when the corresponding byte enable signal BE0, BE1, . . . , or BE7 is active to indicate that a corresponding DRAM is to be accessed, the BRAS comparator is enabled to conduct the address comparison and to generate the active page mishitting signal HIT/MISS when the row address of the memory address MA is not consistent with the row address held in the corresponding BRAS address register.

When the active page mishitting signal HIT/MISS is generated, the corresponding BRAS address register is updated to latch the row address of the memory address MA outputted at that time. On the other hand, when the page mishitting signal HIT/MISS is inactive, the corresponding BRAS address register is not updated, and therefore, continues to hold the already latched row address.

The Byte RAS generation circuit 5 receives the byte enable signal BE<7–0> from the CPU 4, the memory cycle start signal MEM CYCLE from the memory controller 1, and the page mishitting signals HIT/MISS outputted from the BRAS comparators 70 to 77 of the page hit controller 8. More specifically, the Byte RAS generation circuit 5 includes a BRAS0 generator 50, a BRAS1 generator 51, . . . , and a BRAS7 generator 57, all of which will be generically called a "BRAS generator". The BRAS generators 50, 51, . . . , and 57 are provided one for each one byte. Each of the BRAS generators 50 to 57 receives the memory cycle start signal MEM CYCLE in parallel, and also receives a corresponding one BE0, BE1, . . . , or BE7 of the byte enable signal BE<7–0>, and the page mishitting signal HIT/MISS of a corresponding BRAS comparator 70, 71, . . . , or 77.

When any one of the page mishitting signals HIT/MISS outputted from the BRAS comparators 70 to 77 is activated to indicate a mishitting of the row address, the Byte RAS generation circuit 5 outputs a page miss signal PAGE MISS to the memory controller 1, to cause the memory controller 1 to delay an output of the memory cycle start signal MEM CYCLE, and on the other hand, the BRAS generator enabled by an active byte enable signal BE, brings its BRAS signal into an inactive condition, so that the corresponding BRAS related internal. circuit is precharged. The other BRAS generators which are not enabled by the corresponding byte enable signals BE, maintain their BRAS signal as it is. When the memory cycle start signal MEM CYCLE is outputted from memory controller 1 after a delay time which ensures a necessary precharge time, a memory cycle starts, and the BRAS generator enabled by the active byte enable signal BE brings its BRAS signal into an active condition, so that data is read out to the sense amplifiers. Thereafter, when the column address strobe signal CAS is activated, the selected read-out data is outputted. On the other hand, the other BRAS generators which are not enabled by the corresponding byte enable signals BE, continue to maintain their BRAS signal as it is.

On the other hand, when none of the page mishittinig signals HIT/MISS outputted from the BRAS comparators 70 to 77 is activated, namely, when the row address of the memory address MA is consistent with the row address held in the BRAS address register corresponding to the byte to be accessed (row address hitting), the Byte RAS generation circuit 5 does not output the page miss signal PAGE MISS to the memory controller 1. Therefore, the memory controller 1 outputs the memory cycle start signal MEM CYCLE without delaying the memory cycle start signal MEM CYCLE, in order to instruct to start a memory cycle. Thus, the BRAS generator enabled by an active byte enable signal BE, continues to maintain its BRAS signal in the active condition (since the BRAS signal is in the active condition because the same row address was already accessed in the same page mode memory access), and on the other hand, the other BRAS generators which are not enabled by the corresponding active byte enable signals BE, continues to maintain their BRAS signal as it is. Thereafter, when the column address strobe signal CAS is activated, the selected read-out data is outputted.

Figure 5A:
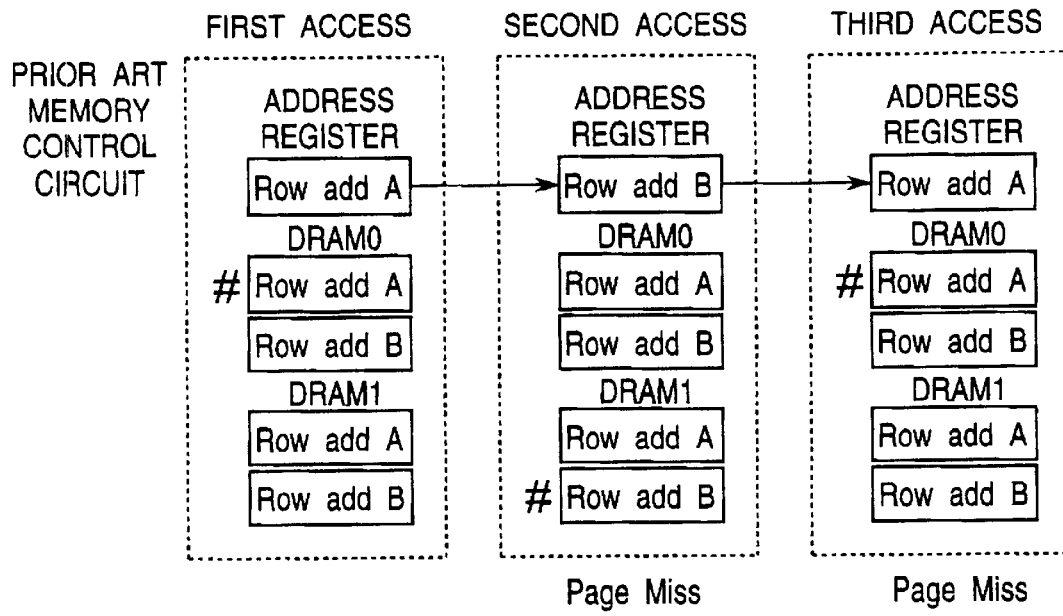
FIGS. 5A and 5B illustrate a memory access operation in the prior art memory control circuit and in the memory control circuit in accordance with the present invention, for explaining an advantage of the page mode memory access in units of byte in accordance with the present invention.
Figure 5B:
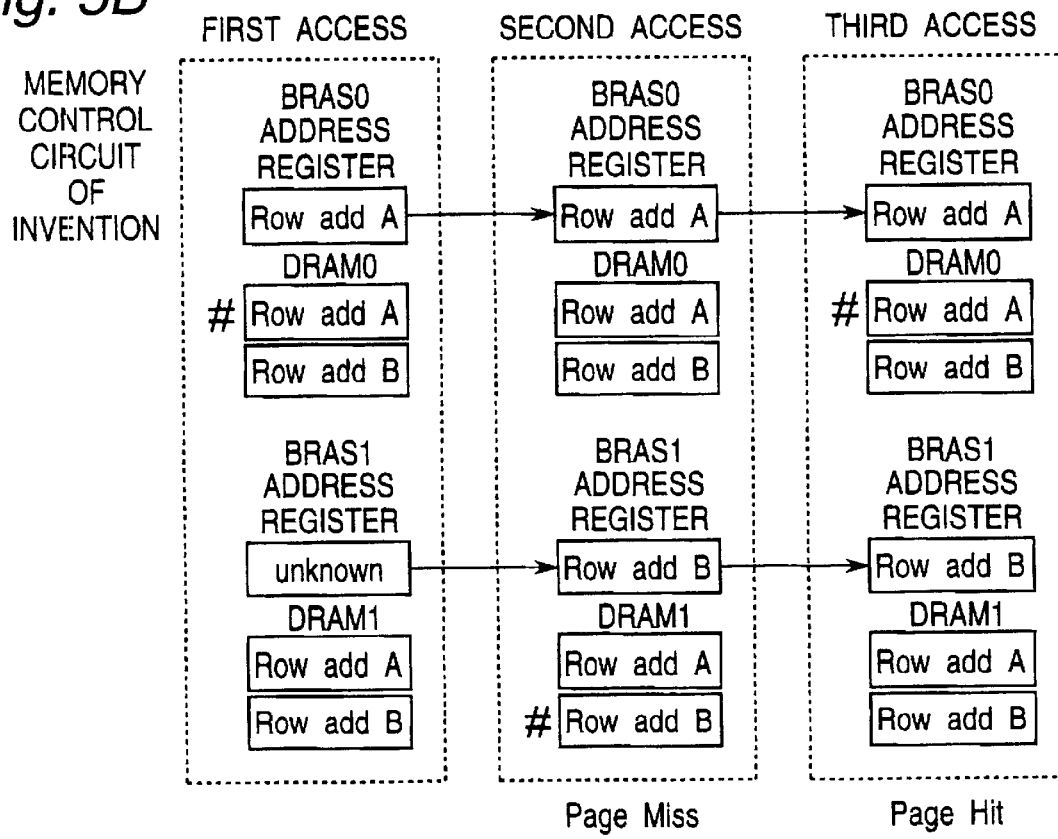

Next, an advantage of the page mode memory access operation in units of byte in accordance with the present invention will be described with reference to FIGS. 5A and 5B, assuming that, the memory is accessed in units of byte, and a row address "Row add A" is strobed in a first access, a row address "Row add B" is strobed in a second access, and the row address "Row add A" is strobed again in a third access. FIG. 5A illustrates the page mode memory access operation in the prior art memory control circuit, and FIG. 5B illustrates the page mode memory access operation in the memory control circuit of the embodiment shown in FIGS. 2 and 3. In FIGS. 5A and 5B, the mark "#" indicates an actually accessed address.

In the prior art memory control circuit, in the first access, the row address "Row add A" in the DRAM0 is accessed, and the row address "Row add A" is latched in an address register (not shown) provided in common to all DRAM0 to DRAM7. In the second access, the row address "Row add B" in the DRAM1 is accessed. Since the row address "Row add B" is not consistent with the row address "Row add A" held in the address register (page missing), the address register is updated to newly hold the row address "Row add B". In the third access, the row address "Row add A" in the DRAM0 is accessed again. However, since the address register has been already updated to hold the row address "Row add B", the row address "Row add A" in the third access is not consistent with the row address "Row add B" held in the address register (page missing), and therefore, the address register is updated to hold the row address "Row add A" again. On the other hand, at each time the page missing occurs, the memory controller deactivates the row address strobe signal into the inactive condition, in order to precharge the RAS related internal circuit. After lapse of a predetermined precharging time, the memory controller generates the memory cycle start signal in order to start the memory cycle, so that the row address strobe signal is brought into the active condition.

In the page mode memory access operation of the prior art memory control circuit, so long as the row address does not change, the row address strobe signal RAS is maintained in the active condition. However, at each time the row address changes, namely, at each page missing, the row address strobe signal RAS is brought into the inactive condition at once to precharge the RAS related internal circuit, and then is brought into the active condition. Namely, the RAS signal is regenerated at each page missing. Therefore, in the above mentioned example, since the page missing occurs in all of the first to third accesses, the RAS related internal circuit is precharged in each of the first to third accesses, with the result that when the row address changes, a consumed electric power is not saved and the access time is not shortened.

In the embodiment of the memory control circuit in accordance with the present invention, since BRAS address registers are provided one for each one type, and the page hit/miss is discriminated in units of byte. Therefore, when the row address "Row add A" in the DRAM0 is accessed in the first access in units of byte, the BRAS0 comparator 70 is enabled by the corresponding active byte enable signal BE0, to compare the supplied row address "Row add A" with an unknown content of the corresponding BRAS0 address register 60. Here, assuming that the supplied row address "Row add A" is not consistent with the unknown content of the BRAS0 address register 60 (page missing), the BRAS0 comparator 70 generates the active page mishitting signal HIT/MISS so that the BRAS0 generator 50 brings the row address strobe signal BRAS0 into the inactive condition to precharge a corresponding RAS related internal circuit of the DRAM0, and the supplied row address "Row add A" is latched in the corresponding BRAS0 address register 60. Accordingly, the page miss signal PAGE MISS is outputted to the memory controller 1, so that the outputting of the memory cycle start signal MEM CYCLE is delayed to ensure a necessary precharge time. After lapse of the necessary precharge time, the memory cycle start signal MEM CYCLE is outputted to activate the byte RAS signal BRAS0 for the DRAM0. On the other hand, since the other byte enable signals BE1 to BE7 are not activated, the other BRAS comparators 71 to 77 are not enabled so that the other BRAS address registers 61 to 67 are not updated. Namely, the row address "Row add A" in the first access is latched in only the BRAS0 address register 60 for the DRAM0.

In the second access in units of byte, the row address "Row add B" in the DRAM1 is accessed, and therefore, the BRAS1 comparator 71 is enabled by the corresponding active byte enable signal BE1, to compare the supplied row address "Row add B" with an unknown content of the corresponding BRAS1 address register 61. Here, assuming that the supplied row address "Row add B" is not consistent with the unknown content of the BRAS1 address register 61 (page missing), the BRAS1 comparator 71 generates the active page mishitting signal HIT/MISS so that the BRAS1 generator 51 brings the row address strobe signal BRAS1 into the inactive condition to precharge a corresponding RAS related internal circuit of the DRAM1, and the supplied row address "Row add B" is latched in the corresponding BRAS1 address register 61. Accordingly, the page miss signal PAGE MISS is outputted to the memory controller 1, so that the outputting of the memory cycle start signal MEM CYCLE is delayed to ensure a necessary precharge time. After lapse of the necessary precharge time, the memory cycle start signal MEM CYCLE is outputted to activate the byte RAS signal BRAS1 for the DRAM1. On the other hand, since the other byte enable signals BE0 and BE2 to BE7 are not activated, the other BRAS comparators 70 and 72 to 77 axe not enabled so that the other BRAS address registers 60 and 62 to 67 are not updated. Namely, the row address "Row add B" in the second access is latched in only the BRAS1 address register 61 for the DRAM1, and the BRAS0 address register 60 for the DRAM0 continues to hold the row address "Row add A".

In the third access in units of byte, the row address "Row add A" in the DRAM0 is accessed again, and the BRAS0 comparator 70 is enabled by the corresponding active byte enable signal BE0, to compare the supplied row address "Row add A" with the row address "Row add A" held in the corresponding BRAS0 address register 60. Therefore, since the supplied row address "Row add A" is consistent with the content of the BRAS0 address register 60 (page hitting), the BRAS0 comparator 70 maintains the page mishitting signal HIT/MISS in the inactive condition, so that the BRAS0 generator 50 continues to maintain the row address strobe signal BRAS0 in the active condition, without deactivating the row address strobe signal BRAS0, and the row address "Row add A" is maintained in the corresponding BRAS0 address register 60. On the other hand, since the other byte enable signals BE1 to BE7 are not activated, the other BRAS comparators 71 to 77 are not enabled so that the other BRAS address registers 61 to 67 are not updated. Namely, the row address "Row add A" latched in the first access is maintained in the BRAS0 address register 60 for the DRAM0, and the row address "Row add B" latched in the second access is maintained in the BRAS1 address register 61 for the DRAM1. Therefore, the time required for the third access can be shortened by the precharge time which was required at the third access in the prior art memory control circuit, and the consumed electric power can be reduced by the precharging which was required at the third access in the prior art memory control circuit. Namely, the number of regenerations of the row address strobe signal is reduced.

As seen from the above, in the shown embodiment, since the page hit is controlled in units of byte, it is possible to elevate probability of page hitting even if the page address changes, namely, even in discontinuous memory access, and therefore, it is possible to correspondingly reduce the electric power consumed in the memory.

As seen from the above, the memory control circuit in accordance with the present invention is characterized by controlling the row address strobe signal in units of byte so that only a row address strobe signal for a DRAM to be actually accessed is activated, with the result that the consumed electric power can be reduced. As a second feature, the memory control circuit in accordance with the present invention is characterized by controlling the row address strobe signal in units of byte and also performing the page control in units of byte, so that probability of page hitting can be elevated even in discontinuous memory access, with the result that the number of regenertions of the row address strobe signal can be reduced, and therefore, the electric power consumed in the memory can be correspondingly reduced.

The invention has thus been shown and described with reference to the specific embodiments. However, it should be noted that the present invention is in no way limited to the details of the illustrated structures but changes and modifications may be made within the scope of the appended claims.

We claim:

1. A memory control circuit comprising:
    a memory coupled to a data bus having a bus width corresponding to a plurality of bytes;
    a memory control means coupled to said memory for controlling an access to said memory;
    a processing means coupled to said memory control means for controlling said memory control means, said processing means outputting a plurality of byte enable signals corresponding to said plurality of bytes in a one-to-one relation, respectively, said processing means activating at least selected one of said plurality of byte enable signals when said memory is accessed in units of byte; and a row address strobe control means receiving a memory controller signal from said memory control means and said byte enable signals from said processing means, for outputting a plurality of row address strobe signals corresponding to said plurality of bytes in a one-to-one relation, respectively, said plurality of row address strobe signals being supplied to said memory, said row address strobe control means responding to said at least one activated byte enable signal, to selectively activate at least one row address strobe signal corresponding to said at least one activated byte enable signal, whereby said plurality of row address strobe signals are selectively activated in units of byte.

2. A memory control circuit claimed in claim 1 wherein said row address strobe control means includes a row address strobe generating means receiving said byte enable signals from said processing means for outputting said plurality of row address strobe signals, and a page miss discriminating means receiving said byte enable signals from said processing means and a row address to be accessed, from said memory control means, for discriminating a page missing in units of byte when said memory is accessed in units of byte.

3. A memory control circuit claimed in claim 1 wherein after said row address strobe control means receives a memory cycle start signal from said memory control means, said row address strobe control means selectively activates said at least one row address strobe signal.

4. A memory control circuit claimed in claim 1 wherein when said row address strobe control means discriminates a page missing in the memory access in units of byte, said row address strobe control means deactivates said at least one row address strobe signal corresponding to said at least one activated byte enable signal, so that a precharge time is ensured, and said row address strobe control means supplies a page miss signal to said memory control means to cause said memory control means to delay an outputting of a memory cycle start signal, and wherein after said row address strobe control means receives said memory cycle start signal from said memory control means, said row address strobe control means selectively activates said at least one row address strobe signal.

5. A memory control circuit claimed in claim 1 wherein said row address strobe control means includes a plurality of row address registers corresponding to said plurality of bytes in a one-to-one relation, respectively, and a corresponding number of address comparators each enabled by a corresponding byte enable signal to compare a row address supplied from said memory control means with a row address held in a corresponding row address register, so that when said row address supplied from said memory control means is not consistent with said row address held in said corresponding row address register, said address comparator causes only said corresponding row address register to newly hold said row address supplied from said memory control means.

* * * * *